United States Patent [19]

Howell et al.

[11] 4,367,670

[45] Jan. 11, 1983

[54] ENVELOPE GENERATOR EMPLOYING DUAL CHARGE PUMP

[75] Inventors: Stephen L. Howell, Huntingburg; Ralph N. Dietrich, Georgetown, both of Ind.

[73] Assignee: Kimball International, Inc., Jasper, Ind.

[21] Appl. No.: 274,881

[22] Filed: Jun. 18, 1981

[51] Int. Cl.³ .............................................. G10H 1/057
[52] U.S. Cl. ...................................... 84/1.26; 84/1.13
[58] Field of Search ................................. 84/1.13, 1.26

[56] References Cited

U.S. PATENT DOCUMENTS

| | | | |
|---|---|---|---|
| 3,665,091 | 5/1972 | Hirano | 84/1.26 |
| 3,861,263 | 1/1975 | Okudaira | 84/1.26 X |
| 4,205,581 | 6/1980 | Robinson | 84/1.26 |

OTHER PUBLICATIONS

IEEE Journal of Solid-State Circuits, Aug., 1972, Optical Science Consultants, pp. 302-304.

Primary Examiner—Stanley J. Witkowski
Attorney, Agent, or Firm—Gust, Irish, Jeffers & Hoffman

[57] ABSTRACT

An envelope generator for use in an electronic musical instrument, such as an electronic organ, employing a dual charge pump to form the attack and decay portions of the envelope. The envelope generator is adapted to be connected to the envelope control input of the keyer and the other input of the keyer is connected to a tone source. When the appropriate key of the keyboard is depressed, a source of input voltage is connected to the input of the envelope generator and a first charge pump incrementally transfers the input voltage to a capacitor over a first sequence of discrete time frames. The first charge pump circuit comprises a pair of electronic switches clocked 180° out of phase and a capacitor connected between the juncture of the two switches and ground potential. The second mentioned capacitor is much larger than the first mentioned capacitor so that the charge transfer from one to the other takes place in a plurality of discrete steps. A second charge pump connected serially between the first charge pump and the envelope input of the keyer incrementally transfers the voltage on the first mentioned capacitor to another capacitor over a second sequence of discrete time frames. The second charge pump also comprises a pair of electronic switches having a capacitor connected between their juncture and ground potential, and a clock which clocks the electronic switches 180° out of phase at a second frequency higher than the frequency at which the first two electronic switches are clocked. This arrangement has the effect of reducing the magnitude of the discrete steps thereby avoiding the audible distortion associated with prior envelope generators of this type. If desired, the second charge pump can be dual phase so that the effective frequency ratio between the second and first charge pumps is effectively doubled.

23 Claims, 8 Drawing Figures

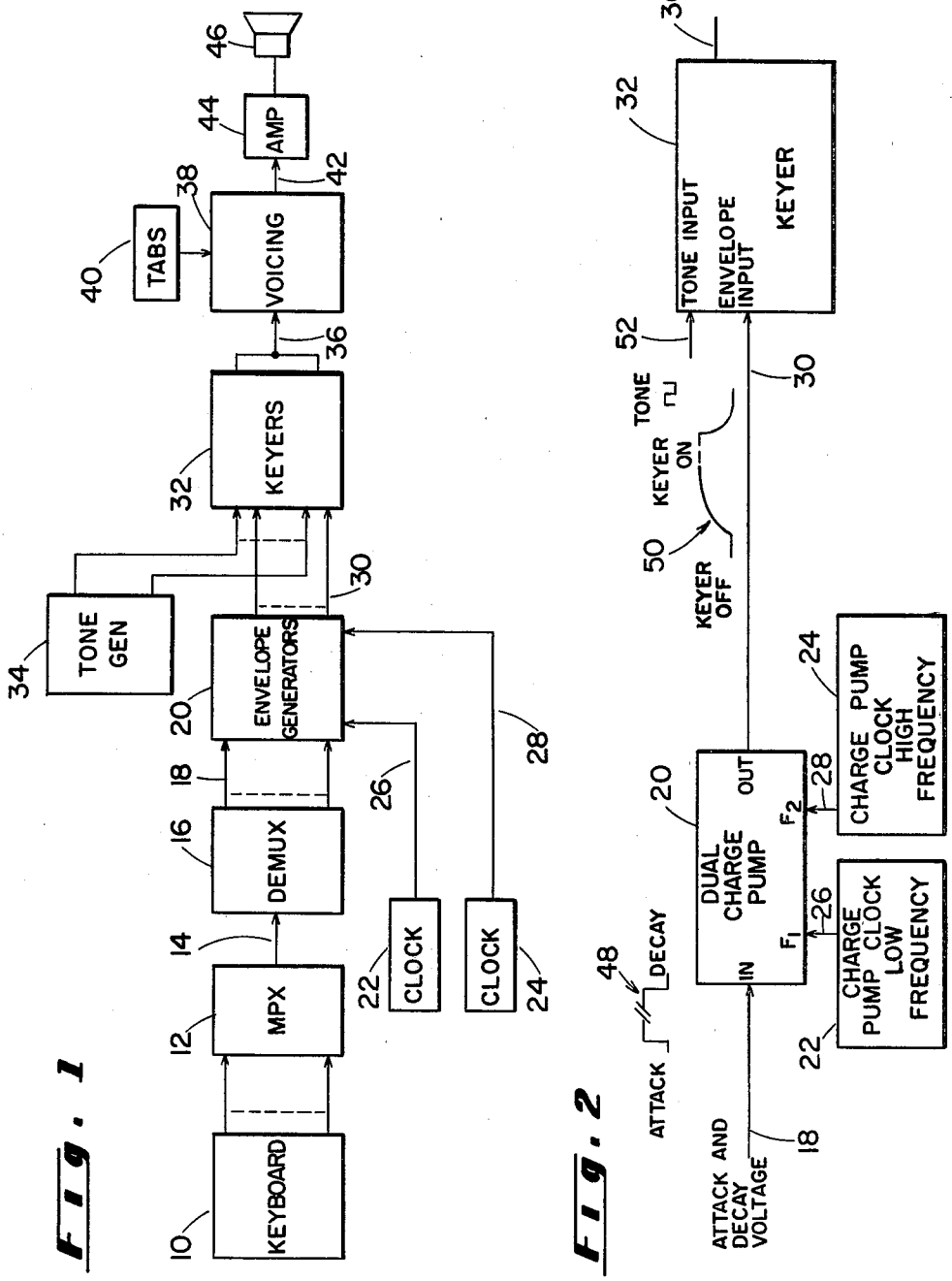

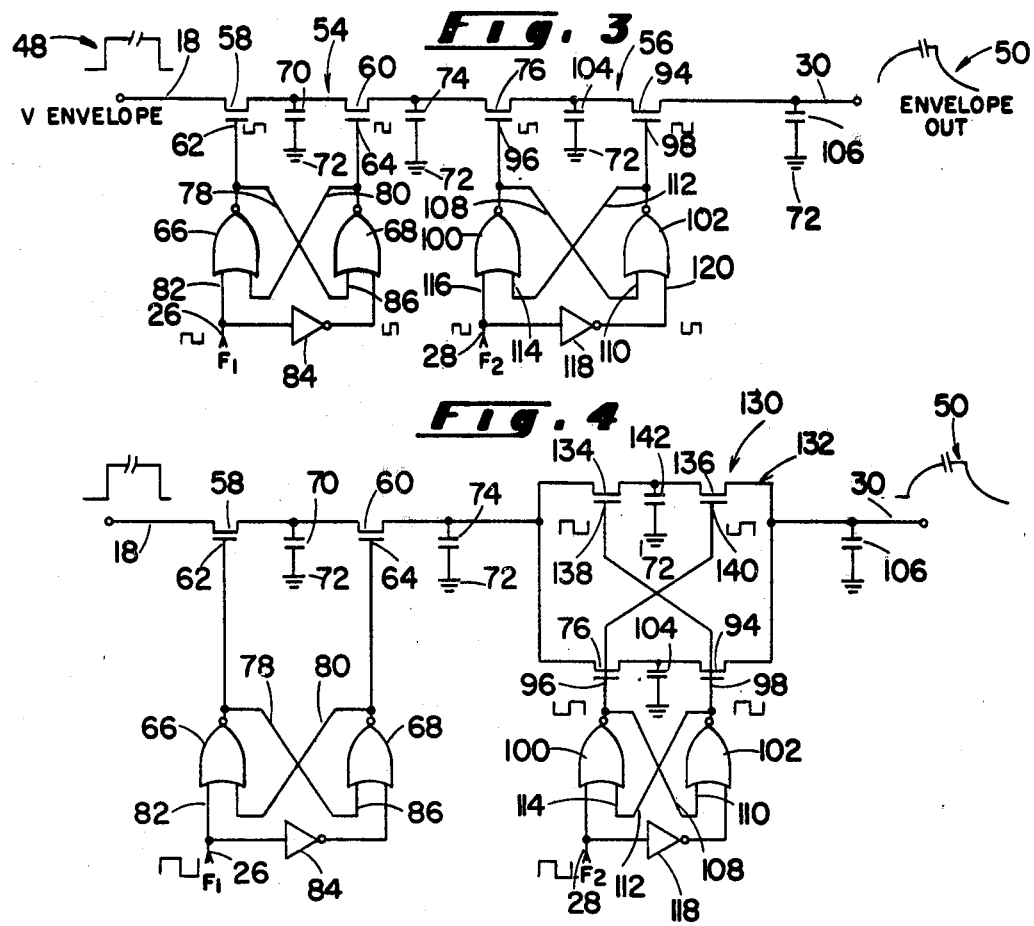
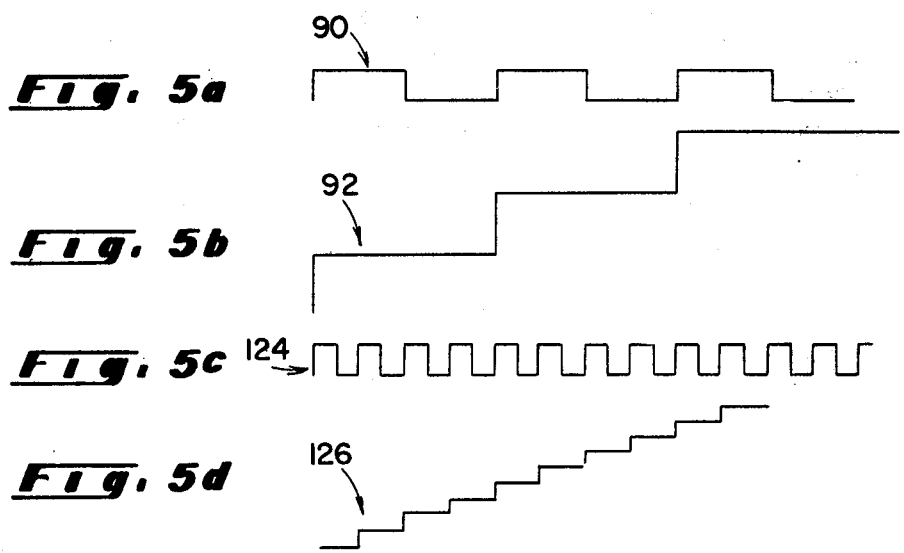

ENVELOPE GENERATOR EMPLOYING DUAL CHARGE PUMP

BACKGROUND OF THE INVENTION

The present invention relates to a dual charge pump system for use in an electronic musical instrument, and in particular to an envelope generator using such a circuit to generate a keying envelope having exponential attack and decay.

Electronic musical instuments, such as electronic organs, employ keyers for connecting tones produced by a tone generator to the output circuitry of the organ in accordance with depressed keys on the keyboard. The individual keyers, which may be dedicated to a single key or footage or shared among all of the tones playable by the organ on an assignment basis, typically have a tone input connected to a tone generator and an envelope input connected to an envelope generator, which in turn is controlled by depressing a key of the keyboard. Since the control voltage produced in response to the depression of a key is generally a DC level which changes almost instantaneously from the key released voltage level to the key depressed voltage level or vice versa, it is necessary to convert this abrupt change in voltage to an exponential curve having an attack and decay, respectively, characteristic of the instrument or voice selected.

A method commonly used to control the rate of attack or decay of a keyer control signal employs a capacitor-resistor network having a desired time constant. The keyer control signal is obtained by the voltage impressed upon the capacitor, which will charge or discharge at a controlled rate, as determined by the parameters of the network. With the advent of semiconductor technology and the ability to integrate thousands of circuit elements on a single chip, the electronic organ industry has moved rapidly to place greater and greater portions of the electronic circuitry for the organ on integrated circuit chips. In the past, however, controlling the keyer control signals by the use of a capacitor-resistor network has required the use of capacitors external to the chip because of the large capacitor values required.

Subsequently, keyer systems have been developed wherein the equivalent of the RC envelope generation circuit can be completely integrated through the use of a charge pump circuit. In U.S. Pat. No. 4,205,581 such an envelope generation circuit is disclosed wherein the abrupt level change of the keying voltage is converted to an exponential curve by the use of a pair of electronic switches and a pair of capacitors. Electronic switches, which can be field effect transistors or other bidirectional electronic switches, are connected in series and one of the capacitors is connected to the common terminal of the transistors and the second capacitor is connected to the second terminal of one of the transistors with the opposite sides of the capacitors connected to a reference potential, such as ground. Each of the transistors is provided with a gate terminal which controls the impedance of the transistor, and gating signals are supplied to the gates thereof alternatively with the frequency of the gating signals determining the relative time constant established from the initial onset of the keyer activating signal. Also controlling the time constant is the ratio between the two capacitors, which is generally quite large, such as 90:1. The control voltage developed on the second capacitor is connected to the keyer envelope input which may be, for example, the gate terminal of a field effect transistor forming the keyer.

The charge at the input of the envelope generator is immediately transferred to the first capacitor when the first series electronic switch conducts. On the next half cycle, the first switch is turned off and the second switch conducts thereby transferring charge from the first capacitor to the second capacitor in accordance with the ratio of the capacitors. Thus, the voltage at the input and on the first capacitor is incrementally transferred to the second capacitor as the electronic switches are rapidly clocked so that after a given number of clock cycles, the voltage on the second capacitor is the same as that on the first capacitor and on the input of the envelope generator. This voltage, which rises or falls exponentially in discrete steps, causes keying of the tone signal at the other input of the keyer to increase or fall in amplitude correspondingly thereby producing the characteristic attack or decay associated with organ tones. U.S. Pat. No. 4,205,581 is expressly incorporated herein by reference.

Although the use of this type of charge pump in a keyer results in substantial savings because of the ability to completely integrate it, the fact that the wave form changes from its minimum to its maximum or vice versa in a plurality of discrete steps rather than as a smooth wave as was the case with discrete RC circuits, introduces audible distortion. This distortion appears as a signal at the frequency of the steps and introduces a twang into the keyed tone. Although this distortion can be reduced by reducing the amplitude changes of the individual steps, this requires a larger capacitance ratio. There is an upper limit to the ratio of capacitors which can be integrated, however, and it has not proven feasible to increase this ratio to the point where the audible distortion can be reduced to a satisfactory level.

SUMMARY OF THE INVENTION

The problems and inherent disadvantages of the above-discussed single charge pump used for keying tones in an electronic organ are overcome by the dual charge pump circuit of the present invention. The effective capacitance ratio is increased by coupling a second charge pump circuit to the first serially between it and the envelope control input of the keyer. The second charge pump circuit incrementally transfers the charge on the second capacitor of the first charge pump to yet another capacitor which is connected to the envelope control input of the keyer. The second charge pump is clocked at a frequency higher than that of the first charge pump, such as a frequency four times as high, so that each incremental increase of the voltage on the output capacitor of the first charge pump is broken down into a plurality of steps each of which is smaller than the steps produced by the first charge pump. In the example mentioned wherein the clocking frequency of the second charge pump is four times as high as that of the first, each incremental step of voltage change produced by the first charge pump is broken down into four steps each of which is approximately one-fourth as great as the individual step produced by the first charge pump. This produces a wave form which better approximates a smoother curve than that produced by the single charge pump, and since the clocking frequency is four times as high, the frequency of the distortion may be above the audible range, depending upon the actual frequency values utilized.

The effective capacitance ratio and effective clocking frequency can be doubled by configuring the second charge pump in a dual phase arrangement having two parallel branches wherein the clocking of one branch is 180° out of phase with the other branch. This effectively doubles the frequency of operation, which may be sufficient to take it out of the audible range.

Specifically, the present invention relates to an electronic musical instrument having means for generating tones in response to the actuation of a keyboard wherein the improvement is an envelope generator for controlling the attack and decay of the tones. The envelope generator comprises a source of input voltage connected to an input of the envelope generator, an output, a first charge pump comprising means for incrementally transferring the input voltage to a first capacitor over a first sequence of discrete time frames wherein the charge pump comprises a first electronic switch device interposed between the input and a first capacitor and clock means for switching the electronic switch device on and off at a first frequency. A second charge pump is connected in series with the first charge pump and comprises means for incrementally transferring the voltage on the first capacitor to a second capacitor over a second sequence of discrete time frames, the second charge pump having an input connected to the first capacitor. The second charge pump comprises a second electronic switch device and the clock means switches the second electronic switch device on and off at a second frequency at least twice as high as the first frequency.

In accordance with a preferred embodiment, the invention comprises a dual charge pump circuit for use in an electronic musical instrument comprising an input terminal adapted to be connected to an input potential, such as a keying control signal, and an output terminal adapted to be connected to the envelope control input of a keyer. The charge pump circuit comprises a first charge pump including first and second serially connected variable conductivity control elements forming a first branch connected between the input and output terminals, a first capacitor connected between the juncture of the first and second elements and the reference potential, and a second capacitor connected between a first branch and a reference potential at a point on the first branch between the first and second elements and the output terminal. First switching means are provided for cyclically, and at a first frequency, maintaining the conductivity of the first element at a high level while at the same time maintaining the conductivity of the second element at a low level and then maintaining the conductivity of the first element at a low level while at the same time maintaining the conductivity of the second element at a high level so as to cause the first capacitor to charge through one of the elements and discharge to the other element each cycle of the switching means. The first and second elements being at opposite levels of conductivity at substantially all times. A second charge pump circuit connected serially between the first charge pump and the output terminal includes third and fourth serially connected variable conductivity elements forming a second branch connected in series between the first branch and the output terminal, a third capacitor connected between the reference potential and the juncture of the third element with the fourth element, and a fourth capacitor connected between the second branch and the reference potential at a point on the second branch between the third and fourth elements and the output terminal. Second switching means cyclically and at a second frequency maintain the conductivity of the third element at a high level while at the same time maintain the conductivity of the fourth element at a low level and then maintain the conductivity of the third element at a low level while at the same time maintain the conductivity of the fourth element at a high level so as to cause the third capacitor to charge through one of the third or fourth elements and discharge through the other each cycle of the second switching means. The second frequency is higher than the first frequency, and the first and second capacitors and the third and fourth capacitors differ in size from each other.

It is an object of the present invention to provide a circuit suitable for use in generating keying envelopes in electronic organs and other electronic musical instruments wherein the circuit can be completely integrated, yet the objectionable audible distortion characteristic of prior art circuits of this type is substantially reduced.

It is another object of the present invention to provide an envelope generation circuit which comprises a relatively few number of circuit elements, and occupies a relatively small amount of chip space when integrated in an LSI.

These and other objects of the present invention and the advantages thereof will be more fully understood by reference to the following detailed description taken in connection with the accompanying drawings.

BRIEF DESCRIPTION OF THE DRAWINGS

FIG. 1 is a simplified block diagram of an electronic organ including the envelope generation circuit of the present invention;

FIG. 2 is a more detailed block diagram of an envelope generator and keyer forming part of the organ illustrated in FIG. 1;

FIG. 3 is a detailed schematic of a dual charge pump in accordance with the present invention;

FIG. 4 is a detailed schematic of a dual phase dual charge pump in accordance with the present invention; and FIGS. 5a–5d are representative wave forms showing the relationship between the first and second charge pumps.

DETAILED DESCRIPTION

With reference now to the drawings, FIG. 1 shows in greatly simplified format a typical electronic organ comprising a keyboard 10 which is multiplexed by multiplexer 12 producing a serial data stream on line 14. Demultiplexer 16 demultiplexes the serial data on line 14 and generates a plurality of DC voltages on the appropriate lines 18 connected to the inputs of respective envelope generators 20. The data stream on line 14 comprises a plurality of time slots wherein pulses appear in those time slots corresponding to depressed keys of the keyboard 10. The demultiplexer 16 is responsive to this data stream and activates those lines 18 which correspond to depressed keys of keyboard 10. When a key is released, demultiplexer 16 changes the voltage level on the line 18 pertaining to that key back to its original level. It should be noted that the keyboard, multiplexer and demultiplexer arrangement shown is greatly simplified and present day electronic organs generally include substantial circuitry for modifying the serial data stream before demultiplexing thereof to implement footage generation and the various features that are generally included in such organs.

Since the signal on a line 18 corresponding to a depressed key abruptly changes from one DC level to another when that key is depressed, this signal cannot be used as the actual keying signal to key the tone because the abrupt starting and stopping of the tone would sound extremely unnatural and would produce undesirable transients. Accordingly, envelope generators 20 must be employed to impart an exponential shape to the rise or fall of the voltage levels on lines 18 when the keys are depressed or released. As discussed earlier, prior art organs have used discrete RC circuits and single charge pumps to perform this function. In the present invention, however, a dual charge pump to be described below is employed, and the clocking for this charge pump is accomplished by clocks 22 and 24 connected thereto by lines 26 and 28, respectively.

The outputs of envelope generators 20 on lines 30 have exponential attack portions, constant level sustain portions, and exponential decay portions in accordance with conventional electronic organ technology. The envelopes on lines 30 are connected to the envelope inputs of the respective keyers 32, the tone inputs thereof being connected to a tone generator indicated generally as 34. The outputs 36 of keyers 32 are appropriately grouped and connected to voicing circuit 38, which is controlled by tabs 40 in the conventional manner. The output 42 of voicing circuit 38 is amplified by amplifier 44, which is connected to a speaker 46. With the exception of the dual clocking and envelope generators 20, the system illustrated in FIG. 1 is completely conventional, although many details have been omitted for the sake of clarity. Such details are extensively disclosed in the prior art relating to electronic organs and therefore need not be set forth herein for an understanding of the present invention.

FIG. 2 illustrates the relationship between the individual envelope generators 20 and keyers 32 in greater detail. As shown, the depression of one of the keys of keyboard 10 pertaining to the particular envelope generator in question produces a wave form 48 which rises abruptly to the attack DC level and then returns abruptly to its previous level when the key is released. Although the keying wave form has been shown as positive going when the key is depressed, it could also be a negative going wave form depending upon the particular design of the organ in question. Envelope generator 20, which is identified as a dual charge pump, is clocked by low frequency clock 22 having a frequency of 100 hz., for example, and by a high frequency clock 24 having a frequency of 400 hz., for example. The output envelope 50 on line 30 will be seen to have an exponential attack, a constant level sustain equal in amplitude to the amplitude of DC control signal 48 on input 18, and an exponential decay when the key is released. The tone input 52 of keyer 32 may be a square wave as illustrated or any other appropriate format, such as a sinusoidal wave. The output of keyer 32 on line 36 is a tone of the same frequency as that on input 52 with an amplitude envelope determined by envelope wave shape 50.

Referring now to FIG. 3, dual charge pump 20, which is the envelope generator for one of the notes playable by the organ, comprises a first charge pump 54 and a second charge pump 56 connected in series between input 18 and the output 30, which is connected to keyer 32. Charge pump 54 comprises field effect transistors 58 and 60 with their source to drain terminals connected in series and having their gate terminals 62 and 64 connected to the outputs of NOR gates 66 and 68, respectively. A capacitor 70 is connected to the juncture of transistors 58 and 60, i.e., to a point between the transistors 58 and 60, and has the other side thereof connected to ground potential 72. A second capacitor 74 is connected to the first branch comprising transistors 58 and 60 at a point between transistor 60 and transistor 76, with its other side connected to ground potential 72. The ratio between capacitor 74 and capacitor 70 is quite large such as, in an exemplary embodiment, in the ratio of 90:1. For example, capacitor 74 may be 0.009 microfarads and capacitor 70 would then be 100 picofarads.

NOR gate 66 has its output connected by line 78 to one of the inputs of NOR gate 68, and the output of NOR gate 68 is connected by line 80 to one of the inputs of NOR gate 66. The other input 82 of NOR gate 66 is connected to 100 hertz clock 22 by line 26, and clock 22 is connected through inverter 84 to the other input 86 of NOR gate 68.

In operation, the clock train on line 26, which is preferably, but not necessarily, a square wave, causes transistor 58 to conduct on the negative halves and causes transistor 60 to conduct on the positive halves thereof. On the alternate half cycles, the respective transistors 58 and 60 are turned off and have nearly infinite resistance. The clock train 90 on line 26 is illustrated in FIG. 5a in timewise alignment with the output voltage 92 on capacitor 74, which is shown in FIG. 5b.

When clock train 90 goes low, the output of NOR gate 66 goes high thereby placing a positive voltage on the gate terminal 62 for transistor 58 and turning transistor 58 on. Inverter 84, however, inverts the logic 0 on line 26 so that NOR gate 68 is disabled thereby producing a logic 0 on the gate terminal 64 of transistor 60 and turning it off. When a transistor 58 or 60 is turned off, it has a nearly infinite impedance, and when turned on, the impedance is near 0. With transistor 58 turned on and transistor 60 turned off, capacitor 70 is connected directly to input line 18 so that it immediately charges to the input voltage on line 18. On the next clock half cycle, the logic 1 on line 26 causes a logic 0 at the outpt of NOR gate 66 to thereby turn off transistor 58, and causes a logic 1 on the output of NOR gate 68 thereby causing transistor 60 to conduct. When transistor 60 conducts, it transfers charge from capacitor 70 to capacitor 74 in accordance with the ratio between the two capacitors and the charge present on each of them at that time. Referring to FIGS. 5a and 5b, it will be seen that at the leading edge of one of the positive going clock pulses 90, the output voltage on capacitor 74 jumps one level and holds that level for the entire clock cycle. On the next positive going edge, transistor 60 again conducts transferring additional charge onto capacitor 74, which causes another incremental jump in voltage. This process continues until the voltage on capacitor 74 reaches that on capacitor 70, which is always at the input voltage on line 18. As charge accumulates on capacitor 74, however, the amount of voltage increase follows an exponential function, which produces a voltage increase having an attack characteristic of that produced by an electronic organ. When the key is released and the voltage 48 on line 18 returns to its original level, the reverse sequence occurs with the voltage on capacitor 74 being incrementally transferred to capacitor 70 so that when decay is completed, voltage on capacitors 74 and 70 will equal that on input line 18.

The circuit and sequence described above is essentially the same as that of a single charge pump, such as that disclosed in U.S. Pat. No. 4,205,581. In order to smooth out the transitions in voltage thereby greatly reducing the distortion discussed earlier, a second charge pump circuit 56 is connected in series with circuit 54 and the output terminal 30. The second charge pump circuit 56 comprises field effect transistors 76 and 94 with their source to drain paths connected in series and their gate terminals 96 and 98 connected to the outputs of NOR gates 100 and 102. A capacitor 104 is connected to the juncture of transistors 76 and 94 and has its other side connected to ground potential 72. A fourth capacitor 106 is connected between the other side of transistor 94 and ground potential 72 and is the capacitor on which the output envelope 50 appears. Similarly to charge pump circuit 54, the output of NOR gate 100 is connected by line 108 to one of the inputs 110 of NOR gate 102, and the output of NOR gate 102 is connected by line 112 to one of the inputs 114 of NOR gate 100. The other input 116 of NOR gate 100 is connected to high frequency clock output line 28, which is connected to inverter 118 to the other input 120 of NOR gate 102. Capacitor 106 is greater than capacitor 104, having a ratio of 10:1, for example. Capacitor 106 may have a value of 0.001 microfarads and capacitor 104 would then be 100 picofarads. As mentioned earlier, the frequency of clock 24 is higher than that of clock 22, having a ratio thereto of 4:1, for example.

The operation of NOR gates 100 and 102 is identical to that of NOR gates 66 and 68 to alternately turn on and off field effect transistors 76 and 94 on alternate half cycles of the clock train 124 on line 28. Clock train 124 is illustrated in FIG. 5c and the output voltage 126 on capacitor 106 is illustrated in FIG. 5d. Since transistors 76 and 94 are turning off and on at a frequency four times as great as that of transistors 58 and 60, each incremental step on capacitor 74 (FIG. 5b) will be subdivided into four smaller steps as shown in FIG. 5d. The wave forms shown in FIGS. 5a-5d are for the case where clocks 22 and 24 operate in synchronism, a condition which can be achieved if a single master oscillator and divider system is utilized to generate clock trains 90 and 124. Each incremental increase in voltage on capacitor 74 lasts for four complete cycles of clock train 124, and when the voltage on capacitor 74 incrementally increases again to the next level, this discrete step is broken up into four smaller steps. This process continues until the final voltage on capacitor 74, which is the input voltage on line 18, has been reached. Four clock cycles of clock train 124 later, this same voltage will appear on capacitor 106 thereby completing the attack or decay sequence.

The effective frequency of the second charge pump 56 can be doubled by providing a dual phase configuration 130 as illustrated in FIG. 4. With the exception of an additional parallel branch, the circuit of FIG. 4 is identical to that of FIG. 3 and the same reference numerals have been carried over for ease in explanation. This circuit differs in that a charge pump branch 132 is connected in parallel with the previous branch comprising transistors 76 and 94. Branch 132 comprises field effect transistors 134 and 136 connected in series with each other and with transistors 58 and 60, but in parallel with transistors 76 and 94. The gate terminals 138 and 140 of transistors 134 and 136 are connected to the outputs of NOR gates 102 and 100, respectively. A capacitor 142 having the same value as capacitor 104 is connected between the juncture of transistors 134 and 136 and ground potential 72.

In operation, on the positive going edge of the clock train 124 on input 28, NOR gate 100 will turn off transistors 76 and 136 and NOR gate 102 will turn on transistors 134 and 94. This causes charge to be transferred from capacitor 74 to capacitor 142 and the charge on capacitor 104 to be transferred to capacitor 106. On the next half clock cycle when the clock train on line 28 is negative going, NOR gate 100 will turn on transistors 76 and 136 and NOR gate 102 will turn off transistors 94 and 134. This causes charge on capacitor 142, which was previously charged through turned on transistor 134, to be transferred through transistor 136 to capacitor 106, and causes charge from capacitor 74 to be transferred to capacitor 104. Thus, charge transfer to output capacitor 106 occurs on every half cycle of clock train 104, whereas in the embodiment of FIG. 3, charge transfer occurred on every full cycle.

If desired, separate charge pump circuits could be provided for attack and decay, respectively, as in the case where different time constants are desired. Moreover, the attack and decay voltages can be obtained from independent sources and connected to input line 18 by means of a data selector controlled by attack and decay control signals from an attack and decay logic circuit (not shown).

It will be apparent from the foregoing that the rate of decay could be made different from the rate of attack in a single branch circuit by changing the clock frequency at the proper time. Thus, upon depression of playing key, the clock would have one frequency and upon release of a playing key the clock would go to another frequency, thereby providing for the desired difference between the sustain and decay. If it is desired to produce an ADSR envelope, four different frequencies or four dual charge pumps could be switched in sequentially.

The circuit of the present application is not limited to envelope generators but could be used in other applications in electronic organs and elsewhere. For example, in the production of brass tones, not only the amplitude but also the pulse width is modulated during attack, and dual charge pump circuits of the type described herein could be utilized both for the amplitude and pulse width modulation.

While this invention has been described as having a preferred design, it will be understood that it is capable of further modification. This application is, therefore, intended to cover any variations, uses, or adaptations of the invention following the general principles thereof and including such departures from the present disclosure as come within known or customary practice in the art to which this invention pertains and fall within the limits of the appended claims.

What is claimed is:

1. In an electronic musical instrument having means for generating tones in response to the actuation of a keyboard, an envelope generator for controlling the attack and decay of the tones comprising:
   a source of input voltage connected to an input of the envelope generator,
   an output,
   a first charge pump comprising means for incrementally transferring the input voltage to a first capacitor over a first sequence of discrete time frames, said charge pump comprising a first electronic switch device interposed between said input and said first capacitor, and clock means for switching said electronic switch device on and off at a first frequency, and a second charge pump comprising means for incrementally transferring the voltage on said first capacitor to a second capacitor over a second sequence of discrete time frames, said second charge pump being connected in series between said first charge pump and said output, said second charge pump comprising a second electronic switch device, and said clock means switches said second electronic switch device on and off at a second frequency at least twice as high as said first frequency.

2. The apparatus of claim 1 wherein said means for generating tones in response to the actuation of a keyboard includes a keyer having a tone input and an envelope input and an output connected to output circuitry and an acoustic transducer, and the output of said envelope generator is connected to the envelope input of the keyer.

3. A dual charge pump circuit for use in an electronic musical instrument comprising:

an input terminal adapted to be connected to an input potential, an output terminal, a first charge pump circuit including first and second serially connected variable conductivity control elements forming a first branch connected between the input and output terminals, a first capacitor connected between the juncture of said first and second elements and a reference potential, and a second capacitor connected between said first branch and the reference potential at a point on said first branch between said first and second elements and said output terminal, first switching means for cyclically and at a first frequency maintaining the conductivity of said first element at a high level while at the same time maintaining the conductivity of said second element at a low level and then maintaining the conductivity of said first element at a low level while at the same time maintaining the conductivity of said second element at a high level so as to cause said first capacitor to charge through one of said elements and discharge through the other element each cycle of said switching means, said first and second elements being at opposite levels of conductivity at substantially all times, a second charge pump circuit connected serially between said first charge pump circuit and the output terminal including: third and fourth serially connected variable conductivity elements forming a second branch connected in series between said first branch and the output terminal, a third capacitor connected between the reference potential and the juncture of said third element with said fourth element, and a fourth capacitor connected between said second branch and the reference potential at a point on said second branch between the third and fourth elements and the output terminals, and second switching means for cyclically and at a second frequency maintaining the conductivity of said third element at a high level while at the same time maintaining the conductivity of said fourth element at a low level and then maintaining the conductivity of said third element at a low level while at the same time maintaining the conductivity of said fourth element at a high level so as to cause said third capacitor to charge through one of said third or fourth elements and discharge through the other of said third or fourth elements each cycle of the second switching means, said second frequency being higher than said first frequency, said first and second capacitors differing in size from each other and said third and fourth capacitors differing in size from each other.

4. The apparatus of claim 3 wherein: said second frequency is at least twice as high as said first frequency, said first and second capacitors have a ratio of at least ten, and said third and fourth capacitors have a ratio of at least five.

5. The apparatus of claim 3 wherein said elements are electronic switches having respective control inputs, and said first and second switching means comprise means for generating four pulse trains connected respectively to the control inputs of electronic switches, and wherein the pulse train connected to said first element is of the first frequency and 180° out of phase with the pulse train connected to said second element, and the pulse train connected to said third element is of said second frequency and 180° out of phase with the pulse train connected to said fourth element.

6. The apparatus of claim 3 wherein said second charge pump circuit includes: fifth and sixth variable conductivity elements serially connected with each other and forming a third branch connected in parallel with said third and fourth elements, a fifth capacitor connected between the juncture of said fifth and sixth elements and the reference potential, and means for cyclically and at the second frequency maintaining the conductivity of said fifth element at a high level while at the same time maintaining the conductivity of said sixth element at a low level and then maintaining the conductivity of said fifth element at a low level while at the same time maintaining the conductivity of said sixth element at a high level, said fifth and sixth elements being at opposite levels of conductivity at substantially all times, and wherein the conductivity of the third element is 180° out of phase with the conductivity of the fifth element and the conductivity of the fourth element is 180° out of phase with the conductivity of the sixth element, said fourth element is interposed between said third and fourth capacitors and said sixth element is interposed between said fifth and fourth capacitors.

7. The apparatus of claim 3 wherein the reference potential is ground potential.

8. In an electronic musical instrument having a tone generator means for producing tones, an acoustic transducer, a plurality of keyers interposed between the tone generator means and transducer with each keyer having a voltage sensitive control terminal, a source of keyer actuating voltage, a keyboard, and means actuated by the keyboard to connect the keyer actuating voltage to the keyer control terminal, the improvement being an envelope generator connected between the source of keyer actuating voltage and the control terminal of the respective keyer comprising:

a first charge pump circuit including first and second serially connected variable conductivity control elements forming a first branch connected between the source of keying voltage and the control terminal of the respective keyer, first capacitor means connected between the juncture of said first and second elements and a reference potential, and second capacitor means connected between said first branch and the reference potential at a point on said first branch between said elements and the control terminal of the keyer, first switching means for rapidly, repetitively and alternatively raising and lowering the conductivity of said first and second elements at a first frequency such that at all times said elements are at mutually opposite levels of conductivity, a second charge pump circuit including: third and fourth serially connected variable conductivity control elements forming a second branch connected in series with said first branch between said first branch and the control terminal of the respective keyer, third capacitor means connected between the reference potential and the juncture of said third element with said fourth element, and fourth capacitor means connected between said second branch and the reference potential at a point on the second branch between said third and fourth elements and the control terminal of the respective keyer, and second switching means for rapidly, repetitively and alternatively raising and lowering the conductivity of said third and fourth elements at a second frequency higher than the first frequency such that at substantially all times said third and fourth elements are at mutually opposite levels of conductivity, said first and second capacitors differ in size and said third and fourth capacitors differ in size.

9. The apparatus of claim 8 wherein the second frequency is at least twice as high as the first frequency.

10. The apparatus of claim 8 wherein the second frequency is at least three times as high as the first frequency.

11. The apparatus of claim 8 wherein the second frequency is an integer multiple of the first frequency and is synchronized therewith.

12. The apparatus of claim 8 wherein said elements are electronic switches having respective control inputs, and said first and second switching means comprise means for generating four pulse trains connected respectively to the control inputs of the electronic switches, wherein the pulse train connected to said first element is of said first frequency and 180° out of phase with the pulse train connected to said second element, and the pulse train connected to said third element is of said second frequency and 180° out of phase with the pulse train connected to said fourth element.

13. The apparatus of claim 12 wherein said electronic switches are each field effect transistors with a source to drain path in its respective branch and its gate terminal connected to the respective pulse train.

14. The apparatus of claim 8 wherein said elements are electronic switches having respective control inputs, and said first and second switching means comprise first and second clocks connected to the respective control inputs and including an inverter connected between the control input of one of the first and second elements and its respective clock and an inverter connected between the control element of one of the third and fourth elements and its respective clock.

15. The apparatus of claim 8 wherein said first and second capacitor means differ in size by at least a multiple of ten.

16. The apparatus of claim 8 wherein said first and second capacitor means differ in size by at least a multiple of fifty.

17. The apparatus of claim 8 wherein said first and second capacitor means differ in size by at least a multiple of ninety.

18. The apparatus of claim 8 wherein said third and fourth capacitor means differ in size by at least a multiple of five.

19. The apparatus of claim 8 wherein said third and fourth capacitor means differ in size by at least a multiple of ten.

20. The apparatus of claim 8 wherein said envelope generator is an integrated circuit chip having the capacitor means integral therewith.

21. The apparatus of claim 8 wherein said second charge pump circuit includes: fifth and sixth variable conductivity elements serially connected with each other and forming a third branch connected in parallel with said third and fourth elements, a fifth capacitor means connected between the juncture of said fifth and sixth elements and said reference potential, and means for rapidly, repetitively and alternatively raising and lowering the conductivity of said fifth and sixth elements at the second frequency such that at all times said fifth and sixth elements are at mutually opposite levels of conductivity.

22. The apparatus of claim 21 wherein said fourth element is interposed serially between said third capacitor means and said fourth capacitor means and said sixth element is interposed serially between said fifth capacitor means and said fourth capacitor means, said means for raising and lowering the conductivity of said third and fourth elements and raising and lowering the conductivity of said fifth and sixth elements causes said third and fifth elements to be at opposite levels of conductivity at substantially all times and causes said fourth and sixth elements to be at opposite levels of conductivity at substantially all times.

23. The apparatus of claim 8 wherein said reference potential is ground potential.

* * * * *